US011688591B2

United States Patent
(12) United States Patent
Wang et al.

(10) Patent No.: US 11,688,591 B2
(45) Date of Patent: Jun. 27, 2023

(54) PHYSICAL VAPOR DEPOSITION APPARATUS AND METHOD THEREOF

(71) Applicant: TAIWAN SEMICONDUCTOR MANUFACTURING CO., LTD., Hsinchu (TW)

(72) Inventors: Chia-Hsi Wang, Changhua County (TW); Kun-Che Ho, Taipei (TW); Yen-Yu Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/876,489

(22) Filed: Jul. 28, 2022

(65) Prior Publication Data

US 2022/0367161 A1 Nov. 17, 2022

Related U.S. Application Data

(62) Division of application No. 16/572,186, filed on Sep. 16, 2019, now Pat. No. 11,462,394.

(Continued)

(51) Int. Cl.

*H01J 37/34* (2006.01)
*C23C 14/34* (2006.01)

(Continued)

(52) U.S. Cl.

CPC ...... *H01J 37/3455* (2013.01); *C23C 14/3407* (2013.01); *C23C 14/3442* (2013.01);

(Continued)

(58) Field of Classification Search

CPC ............... H01J 37/3455; H01J 37/3461; H01J 37/3435; H01J 37/3414; H01J 37/3405;

(Continued)

(56) References Cited

U.S. PATENT DOCUMENTS 4,714,536 A * 12/1987 Freeman ............. H01J 37/3408 204/192.12
5,855,744 A * 1/1999 Halsey ................ H01J 37/3408 204/298.18

(Continued)

FOREIGN PATENT DOCUMENTS

CN 101775588 A 7/2010
CN 110205592 A * 9/2019 ......... C23C 14/3407

(Continued)

OTHER PUBLICATIONS

DE-102015221211-A1 Translation (Year: 2015).*
JP-03243762-A Translation (Year: 1991).*
CN-110205592-A Translation (Year: 2019).*

*Primary Examiner* — Jennifer Wecker
*Assistant Examiner* — Patrick S Ott
(74) *Attorney, Agent, or Firm* — Maschoff Brennan

(57) ABSTRACT

A an apparatus includes a processing chamber configured to house a workpiece, a target holder in the processing chamber, a first magnetic element positioned over a backside of the target holder, a first arm assembly connected to the first magnetic element, a rotational shaft, and a first hinge mechanism connecting the rotational shaft and the first arm assembly.

20 Claims, 11 Drawing Sheets

300
310
314
302
332
334
330
320
350
340
332
314
310
334
360
S
N
S
N
120
N
S
N
S
200
C
220
312
210
212

Related U.S. Application Data

(60) Provisional application No. 62/738,725, filed on Sep. 28, 2018.

(51) Int. Cl.
*C23C 14/35* (2006.01)
*H01L 21/02* (2006.01)

(52) U.S. Cl.
CPC ........ *C23C 14/351* (2013.01); *H01J 37/3405* (2013.01); *H01J 37/3414* (2013.01); *H01J 37/3435* (2013.01); *H01J 37/3452* (2013.01); *H01J 37/3461* (2013.01); *H01L 21/02631* (2013.01)

(58) Field of Classification Search
CPC ........... H01J 37/3452; H01L 21/02631; C23C 14/3407; C23C 14/3442; C23C 14/351; C23C 14/046; C23C 14/35
See application file for complete search history.

(56) References Cited

U.S. PATENT DOCUMENTS

| | | | | |
|---|---|---|---|---|
| 5,873,989 | A * | 2/1999 | Hughes | H01J 37/3455 204/298.14 |
| 2005/0211548 | A1 | 9/2005 | Gung | |
| 2005/0274610 | A1 | 12/2005 | Iseki | |
| 2008/0099329 | A1* | 5/2008 | Pavloff | H01J 37/3452 204/298.16 |
| 2013/0213797 | A1* | 8/2013 | Lin | H01J 37/3408 204/192.12 |
| 2015/0048735 | A1* | 2/2015 | West | H01J 37/3405 315/39.71 |

FOREIGN PATENT DOCUMENTS

| | | | | |
|---|---|---|---|---|
| DE | 102015221211 | A1 * | 12/2015 | C23C 14/3464 |
| DE | 102015221211 | A1 | 12/2015 | |
| JP | 03243762 | A * | 10/1991 | |
| JP | 04235278 | A | 8/1992 | |
| JP | 03243762 | A | 1/2002 | |
| KR | 20040064055 | A | 7/2004 | |
| TW | 201335410 | A | 9/2013 | |
| TW | 201805462 | A | 2/2018 | |
| WO | 02099841 | A1 | 12/2002 | |

* cited by examiner 300
310
312
314
330
332
334
302
320
340
360
350
120
200
210
212
220
C
N
S

PHYSICAL VAPOR DEPOSITION APPARATUS AND METHOD THEREOF

CROSS-REFERENCE TO RELATED APPLICATION

This application is a Divisional application of U.S. application Ser. No. 16/572,186, filed on Sep. 16, 2019, which claims priority to U.S. Provisional Application Ser. No. 62/738,725, filed Sep. 28, 2018, all of which are herein incorporated by reference in their entirety.

BACKGROUND

Integrated chips are formed by complex fabrication processes, during which a workpiece is subjected to different steps to form one or more semiconductor devices. Some of the processing steps may include forming a thin film onto a semiconductor substrate. Thin films can be deposited onto a semiconductor substrate in a low-pressure processing chamber using physical vapor deposition.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

DETAILED DESCRIPTION

Figure 1:
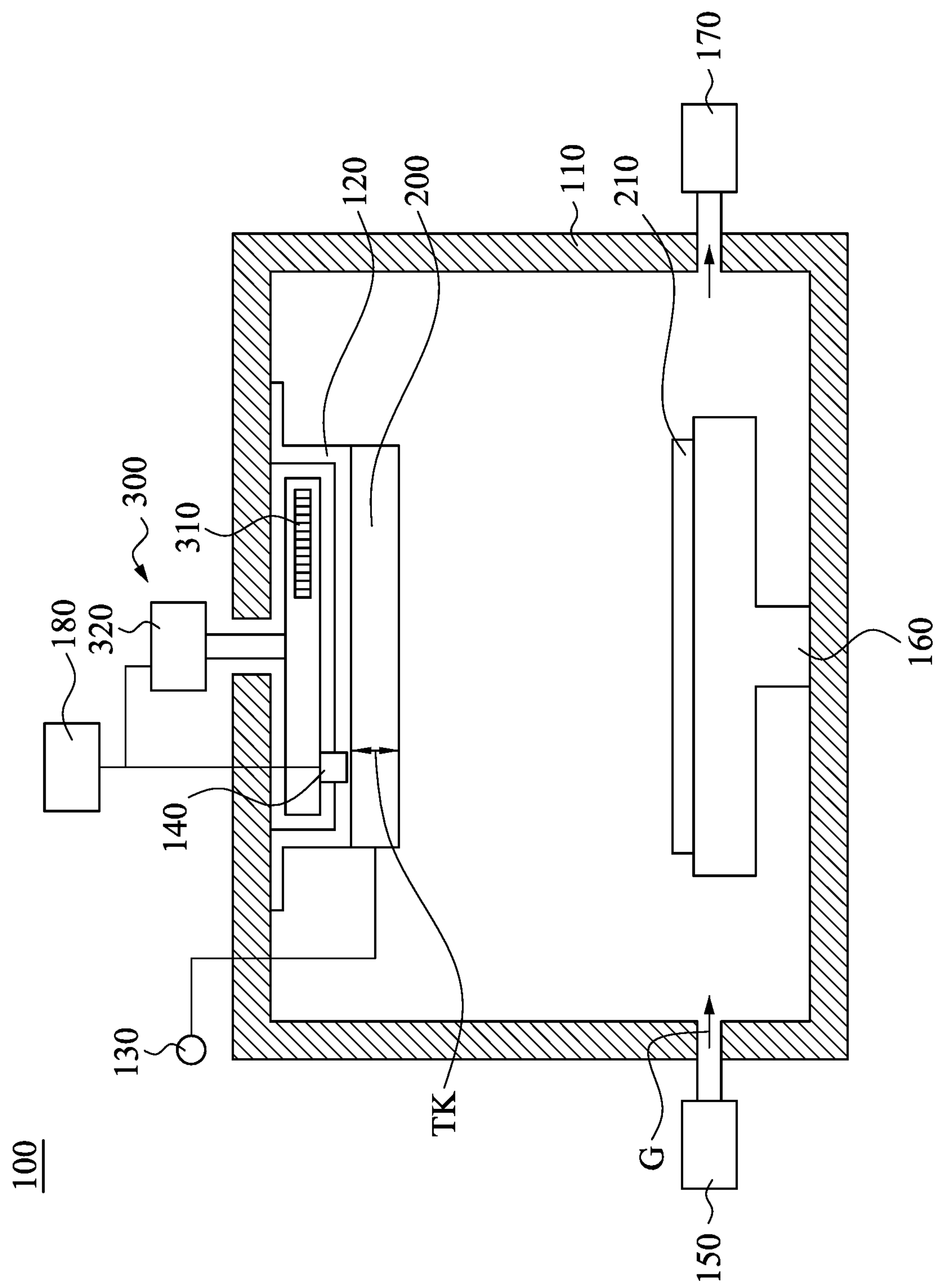
FIG. 1 is a schematic diagram of a physical vapor deposition (PVD) apparatus according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram of a physical vapor deposition (PVD) apparatus 100 according to some embodiments of the present disclosure. As shown in FIG. 1, the PVD apparatus 100 includes a processing chamber 110, a target holder 120, a power supply 130, a thickness detector 140, a gas system 150, a pedestal 160, a vacuum system 170, and a controller 180. The target holder 120 is disposed in the processing chamber 110 and is configured to hold a target 200. The power supply 130 is electrically connected to the target 200 and is configured to apply a bias voltage to the target 200. The thickness detector 140 is disposed in the processing chamber 110 and is configured to detect a thickness TK of the target 200. For example, the thickness detector 140 can be a supersonic detector, a thermos-detector, an X-ray detector, an eddy current thickness gauge, or the like. The gas system 150 is configured to introduce a sputtering gas G into the processing chamber 110. The pedestal 160 is disposed in the processing chamber 110 and is configured to hold a wafer 210. The controller 180 is configured to manage and control the PVD apparatus 100.

The target 200 may include, for example, single elements, borides, carbides, fluorides, oxides, silicides, selenides, sulfides, tellerudes, precious metals, alloys, intermetallics, combinations thereof, or the like. For example, the target 200 may include copper (Cu), silicon (Si), titanium (Ti), tantalum (Ta), tungsten (W), aluminum (Al), titanium nitride (TiN), aluminum nitride (AlN), aluminum oxide ($Al_2O_3$), silicon oxide ($SiO_2$), silicon nitride (SiN), boron nitride (BN), titanium oxide ($TiO_2$), tantalum oxide ($TaO_x$), hafnium oxide ($HfO_2$), combinations thereof, or the like.

The pedestal 160 is disposed in the processing chamber 110 and is configured to support the wafer 210. In some embodiments, the pedestal 160 may be or include a chuck configured to hold the wafer 210. For example, the pedestal 160 may include a mechanical chuck, a vacuum chuck, an electrostatic chuck (“e-chuck”), combinations thereof, or the like. The mechanical chuck may include one or more clamps to secure the wafer 210 to the pedestal 160. The vacuum chuck may include a vacuum aperture coupled to a vacuum source to hold the wafer 210 to the pedestal 160. The e-chuck relies on an electrostatic force generated by an electrode energized by a direct current (DC) voltage source to secure the wafer 210 to the chuck. In some embodiments, a temperature controlling device is connected to the pedestal 160 and is configured to adjust the pedestal temperature, and therefore the wafer temperature. In some embodiments, the pedestal 160 may be vertically movable through a shaft to allow the wafer 210 to be transferred onto the pedestal 160 through a load lock valve in a lower portion of the processing chamber 110 and thereafter raised to a deposition or processing position.

Since the sputtering of the target 200 is easily influenced by impurities, particularly oxidizing agents such as oxygen and water moisture, the processing chamber 110 is evacuated to a pressure lower than the atmospheric pressure by the vacuum system 170 before the sputtering of the target 200 starts. In this way, the impurities like oxygen and water moisture can be removed. In some embodiments, the vacuum system 170 creates the vacuum environment by pumping away gas inside the processing chamber 110.

The gas system 150 introduces the sputtering gas G into the processing chamber 110. The sputtering gas G in the processing chamber 110 is a kind of plasma, which is in fact a partially ionized gas. The partially ionized gas includes various kinds of electrons, ions, uncharged molecules, and radicals. In the case that the PVD apparatus 100 is operated to deposit titanium nitride onto the wafer 210, the sputtering gas G may include, for example, nitrogen.

When the bias voltage is applied to the target 200 by the power supply 130, the target 200 is electrically charged and becomes a cathode in the processing chamber 110. In some embodiments, the power supply 130 is a radio frequency (RF) power source and is applied at a very high frequency (VHF) for forming the plasma from the sputtering gas and ionizing atoms or particles sputtered from the target 200 by the plasma. The sputtering gas may include one or more inert gases, such as a noble gas, or other inert gases. For example, non-limiting examples of suitable sputtering gases may include argon (Ar), helium (He), xenon (Xe), neon (Ne), hydrogen ($H_2$), nitrogen ($N_2$), combinations thereof, or the like. In some embodiments, the power supply 130 includes an additional direct current (DC) power source that may also be applied to the target 200 to increase the rate at which material is sputtered from the target 200. In some embodiments, the DC power source may be applied to the target 200 to direct the plasma towards the target 200.

In some embodiments, the negatively charged target 200 attracts the positively charged ions in the plasma to accelerate and bombard the target 200. Due to the bombardment of the target 200 by the positively charged ions, particles or atoms are ejected from the target 200. The ejected particles or atoms are deposited over the surface of the wafer 210 held by the pedestal 160. During the operation of the PVD apparatus 100, the sputtering of the target 200 occurs and thus the thickness TK of the target 200 gradually decreases. Once the thickness TK of the target 200 is monitored to be less than a predetermined thickness, the operator will terminate the operation and replace the target 200 with a new target 200.

In order to achieve an even bombardment of the target 200 by the charged ions, the PVD apparatus 100 further includes a magnetron 300 that includes a magnetic element 310 and a motor 320. The target holder 120 is disposed between the magnetron 300 and the target 200. During sputtering, the magnetic element 310 is configured to generate a magnetic field. The magnetic field acts with a force on ions within the plasma to trap the ions close to the target 200. The trapped ions collide with neutral gas particles near the target 200, enhancing ionization of the plasma near the target 200 and leading to a higher sputter rate.

The motor 320 is configured to rotate the magnetic element 310, such that the magnetic field generated by the magnetic element 310 moves over the top surface of the target 200. Under the effect of the magnetic field, the bombardment of the target 200 by the ions can be carried out more evenly. However, the strength of the magnetic field of the magnetic element 310 is not uniform along the magnetic element 310. The magnetic field is stronger around north poles and south poles of the magnetic element 310. Consequently, due to the stronger magnetic field, the bombardment is more vigorous at the corresponding locations on the target 200 where the stronger magnetic field is in effect. Hence, the target 200 gets depleted the most at the corresponding location on the target 200 where the strongest magnetic field is in effect. In other words, the thickness TK of the target 200 is not uniform due to the uneven magnetic field distribution of the magnetic element 310.

Figure 2:
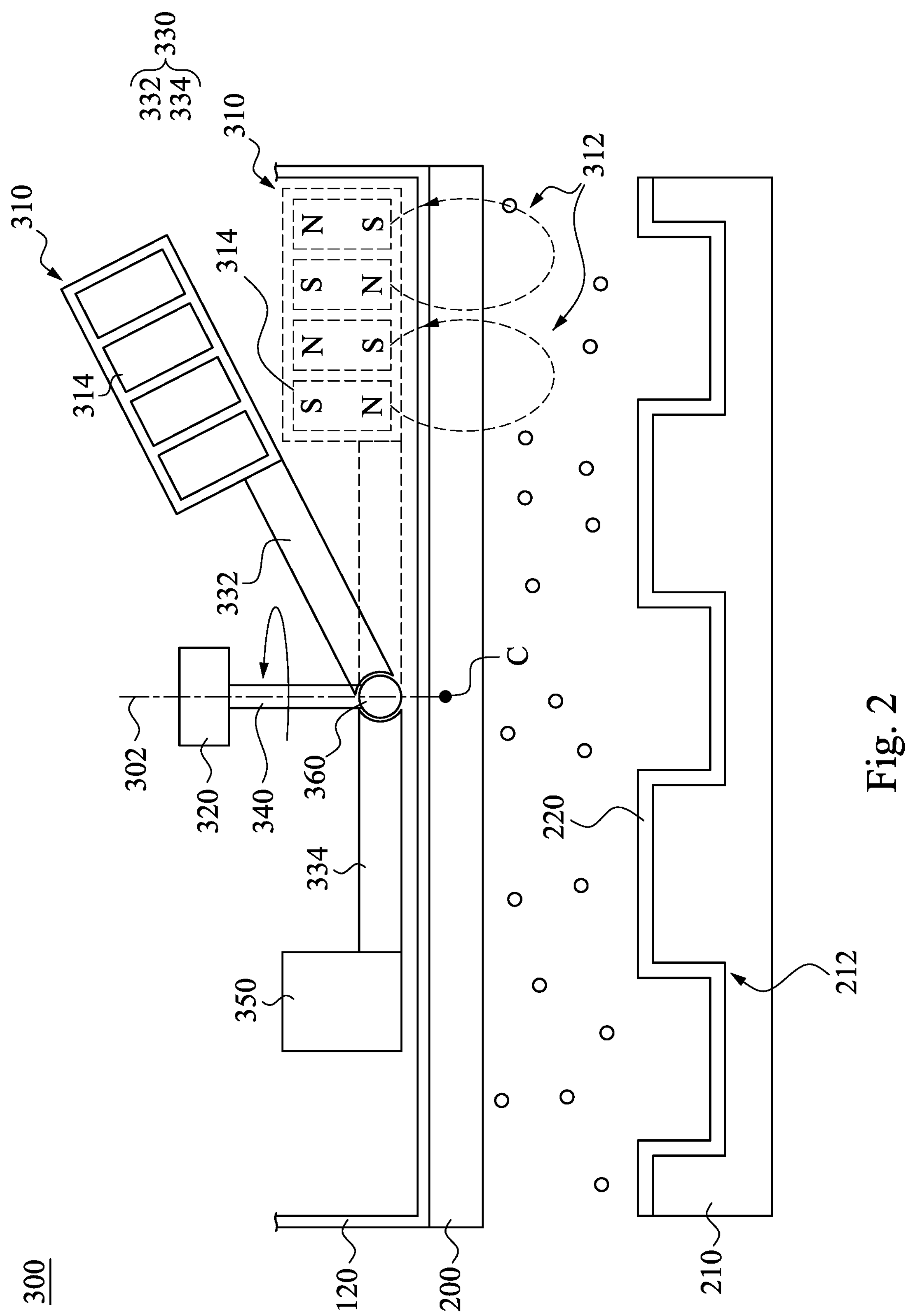
FIG. 2 is a schematic side view of the magnetron in operation according to some embodiments of the disclosure.

Reference is made to FIG. 2, which is a schematic side view of the magnetron 300 in operation according to some embodiments of the disclosure. The magnetron 300 includes the magnetic element 310, the motor 320, a telescopic arm assembly 330, a rotational shaft 340, a counter weight 350, and a hinge mechanism 360. The magnetic element 310 is located at an end of the telescopic arm assembly 330, and the telescopic arm assembly 330 is connected to and rotated by the motor 320, through the rotational shaft 340.

The rotational shaft 340 extends substantially along an axis of rotation 302 that extends substantially through the center C of the target 200. The motor 320 is connected to the rotational shaft 340 and is configured to turn the rotational shaft 340. The magnetron 300 is located on a backside of the target 200 (i.e., a side of the target 200 facing away from the wafer 210), such that the magnetic element 310 is configured to generate one or more magnetic fields 312 that extend through the target 200 to a region below the target 200. The magnetic fields 312 operate upon ions within the processing chamber to enhance the ionization of plasma near the target 200, leading to a higher sputter rate.

The magnetic element 310 may include any type or number of magnets. In some embodiments, the magnetic element 310 includes one or more permanent magnets (e.g., neodymium magnets). Furthermore, the magnetic element 310 may include magnets of any size. As shown in FIG. 2, in some embodiments, the magnetic element 310 includes a plurality of small magnets 314 each having a north pole and a south pole.

By placing small magnets 314 having opposite polarities next to one another, one or more magnetic fields 312 having a high density can be achieved below the target 200. The high density of the magnetic fields 312 provides for good step coverage and good deposition symmetry over the surface of the wafer 210. For example, the wafer 210 has a plurality of trenches 212, and a thin film 220 is deposited to have symmetry between the deposited films on opposing sidewalls of the trenches 212 and to have a film thickness on the trench sidewalls that is approximately equal to the film thickness at the bottoms of the trenches 212. In some embodiments, the film 220 may be a work function metal layer.

The telescopic arm assembly 330 is configured to have a variable length. The magnetic element 310 is connected to the telescopic arm assembly 330. The telescopic arm assembly 330 connects the magnetic element 310 to the rotational shaft 340, which is located approximately at the center C of the target 200 and is driven by the motor 320. The telescopic arm assembly 330 is configured to be adjustable in length, thereby varying the distance from the rotational shaft 340 to the magnetic element 310.

In some embodiments, the telescopic arm assembly 330 includes a linear actuator configured to control changes in the length of the telescopic arm assembly 330. By changing the length of the telescopic arm assembly 330, the position of the magnetic element 310 relative to the rotational shaft 340 is changed.

In some embodiments, the counter weight 350 is located at a position along the telescopic arm assembly 330 that is opposite to the position of the magnetic element 310. For example, as shown in FIG. 2, the counter weight 350 and the magnetic element 310 are on opposite sides of the rotational shaft 340. The counter weight 350 is configured to stabilize the magnetic element 310 by balancing the load of the magnetic element 310. This compensates for the weight of the magnetic element 310 and maintains balance in a rotational plane of the magnetron 300.

In some embodiments, the telescopic arm assembly 330 and the rotational shaft 340 are connected by the hinge mechanism 360, such that the telescopic arm assembly 330 is pivotally connected to the rotational shaft 340. In some embodiments, the telescopic arm assembly 330 includes a first portion 332 and a second portion 334, in which the magnetic element 310 is connected to the first portion 332, the counter weight 350 is connected to the second portion 334, and the first portion 332 and the second portion 334 are connected by the hinge mechanism 360. An angle between the first portion 332 and the second portion 334 is adjustable, by the hinge mechanism 360, and therefore a position and an orientation of the magnetic element 310 relative to the target 200 is also adjustable. For example, the first portion 332 of the telescopic arm assembly 330 and the magnetic element 310 can be tilted relative to the top (back) surface of the target 200 at a non-zero angle. When the magnetic element 310 of the magnetron 300 is tilted relative to the target 200, the loops of the magnetic field are also tilted relative to the target 200, such that the strength of the magnetic field, received by the target 200, can be more uniform.

The telescopic arm assembly 330 and the hinge mechanism 360 are electrically connected to and controlled by the controller 180 (as shown in FIG. 1). The controller 180 is a computer with software for controlling the movements of the magnetic element 310, such as motion of the magnetic element 310 radially relative to the rotational shaft 340. Furthermore, the controller 180 controls the tilting of the magnetic element 310 and the telescopic arm assembly 330. By changing the speed of rotation, the length of the telescopic arm assembly 330, and the tilting angle of the magnetic element 310, a substantially uniform consumption of the target 200 can be achieved.

Figure 3A:
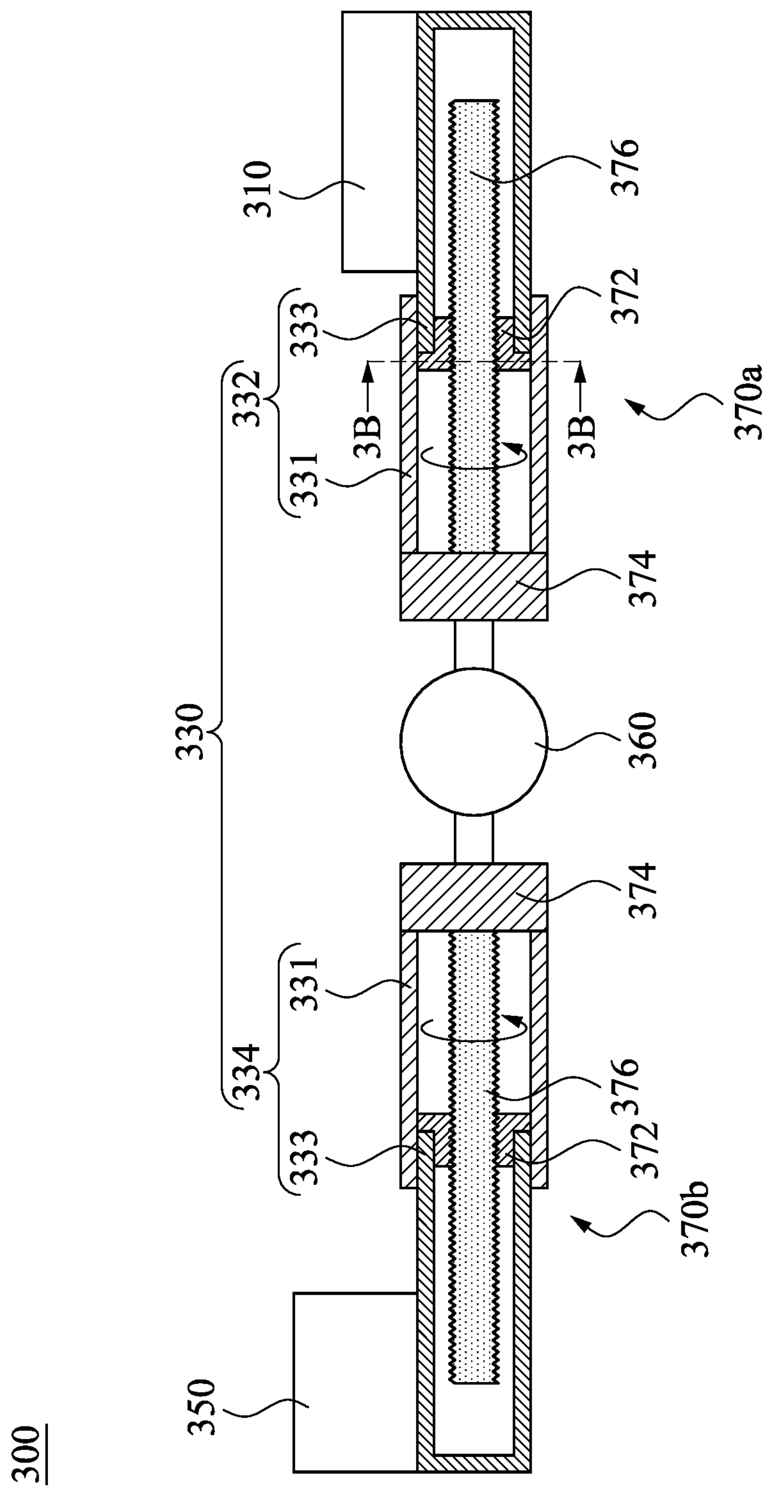
FIGS. 3A and 3B are different cross-sectional views of the telescopic arm assembly, according to some embodiments of the disclosure.
Figure 3B:
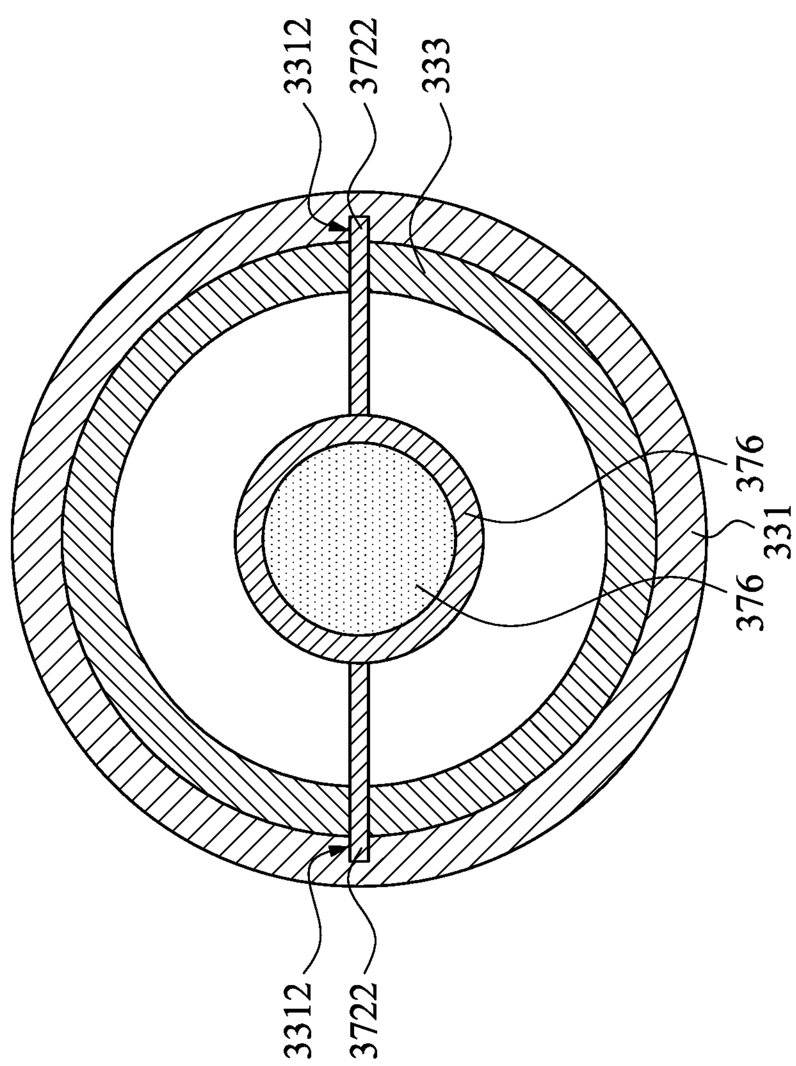

Reference is made to FIGS. 3A and 3B, which are cross-sectional views of the telescopic arm assembly 330 taken along different directions according to some embodiments of the disclosure. In some embodiments, the linear actuator includes a first linear actuator **370*a* disposed in the first portion 332 of the telescopic arm assembly 330 and a second linear actuator 370*b* disposed in the second portion 334 of the telescopic arm assembly 330. The first linear actuator 370*a* is configured to create a linear motion for the magnetic element 310, and the second linear actuator 370*b* is configured to create a linear motion for the counter weight 350**.

In some embodiments, the first and second linear actuators **370*a* and 370*b* each includes a nut 372, a motor 374, and a lead screw 376. Each of the first and second portions 332 and 334 has a fixed cover 331 and a sliding tube 333. The nut 372 is threaded onto the lead screw 376. The nut 372 is connected to the sliding tube 333. The motor 374 is connected to the fixed cover 331. The magnetic element 310 or the counter weight 350 is disposed on the sliding tube 333. The motor 374 is configured to rotate the lead screw 376**.

In each of the first and second linear actuators **370*a* and 370*b*, the motor 374 can be, for example, a DC brush motor, a DC brushless motor, a stepper motor, an induction motor, or the like. The lead screw 376 has a continuous helical thread machined on its circumference running along the length. The nut 372 may be a lead nut or ball nut with corresponding helical threads. The nut 372 is further coupled to the fixed cover 331 and is able to slide relative to the fixed cover 331. For example, the nut 372 includes two flanges 3722, and the fixed cover 331 includes two slits 3312. The flanges 3722 of the nut 372 are coupled to the slits 3312 of the fixed cover 331, such that the nut 372 interlocks with the fixed cover 331 to prevent the nut 372 from rotating with the lead screw 376. Therefore, when the lead screw 376 is rotated, the nut 372 is driven along the threads. The direction of motion of the nut 372 depends on the direction of rotation of the lead screw 376. The rotational motion of the lead screw 376 is converted to a linear motion of the sliding tube 333 when the lead screw 376 is driven by the motor 374. In some other embodiments, the first linear actuator 370*a* and/or the second linear actuator 370*b* may include other suitable linear actuators, such as mechanical actuators, hydraulic actuators, pneumatic actuators, piezoelectric actuators, twisted and coiled polymer (TCP) actuators, electro-mechanical actuators, or the like. In some embodiments, the first linear actuator 370*a* and the second linear actuator 370*b* are controlled by the controller 180 (as shown in FIG. 1**).

Figure 4A:
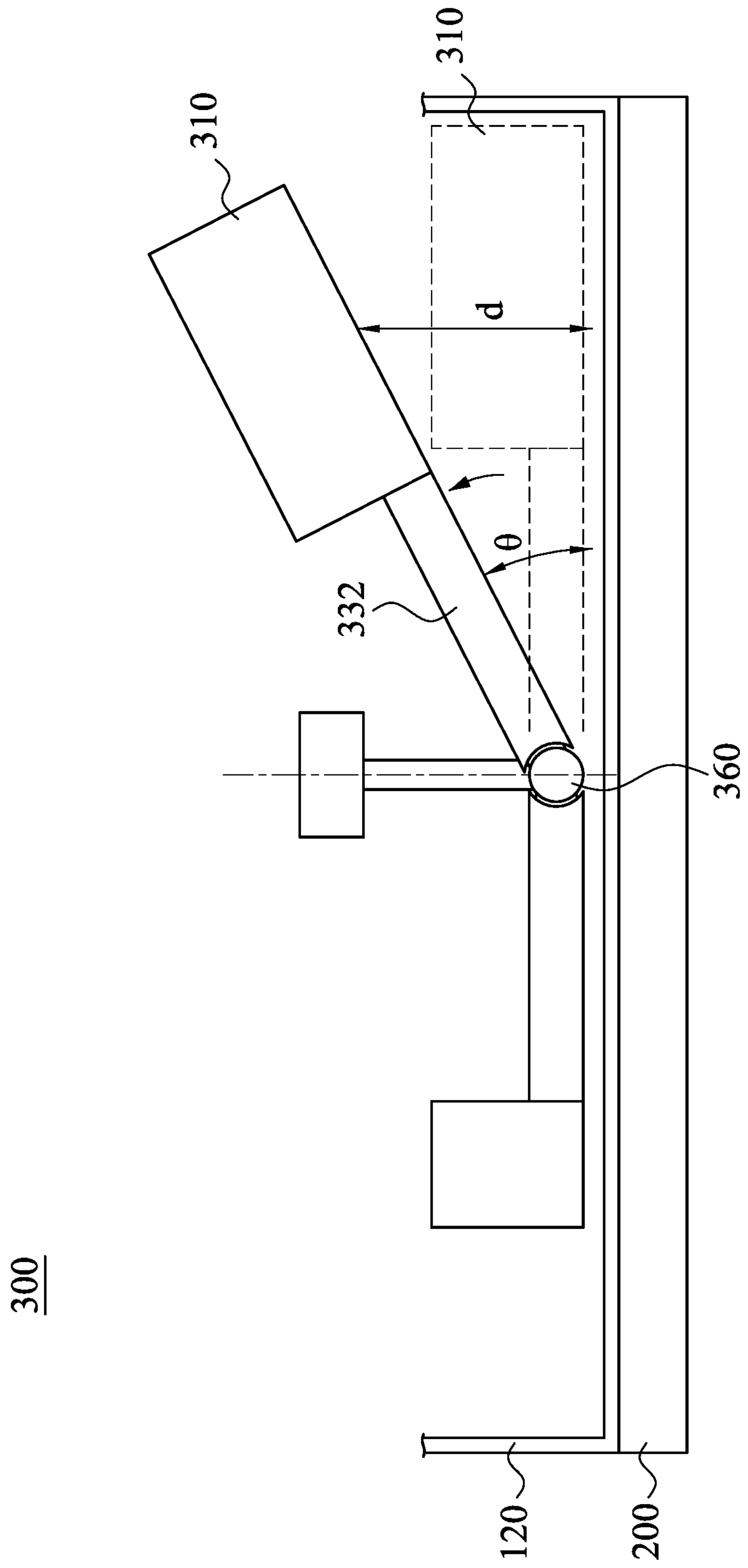
FIG. 4A and FIG. 4B are schematic side views of the magnetron in different operation states according to some embodiments of the disclosure.
Figure 4B:
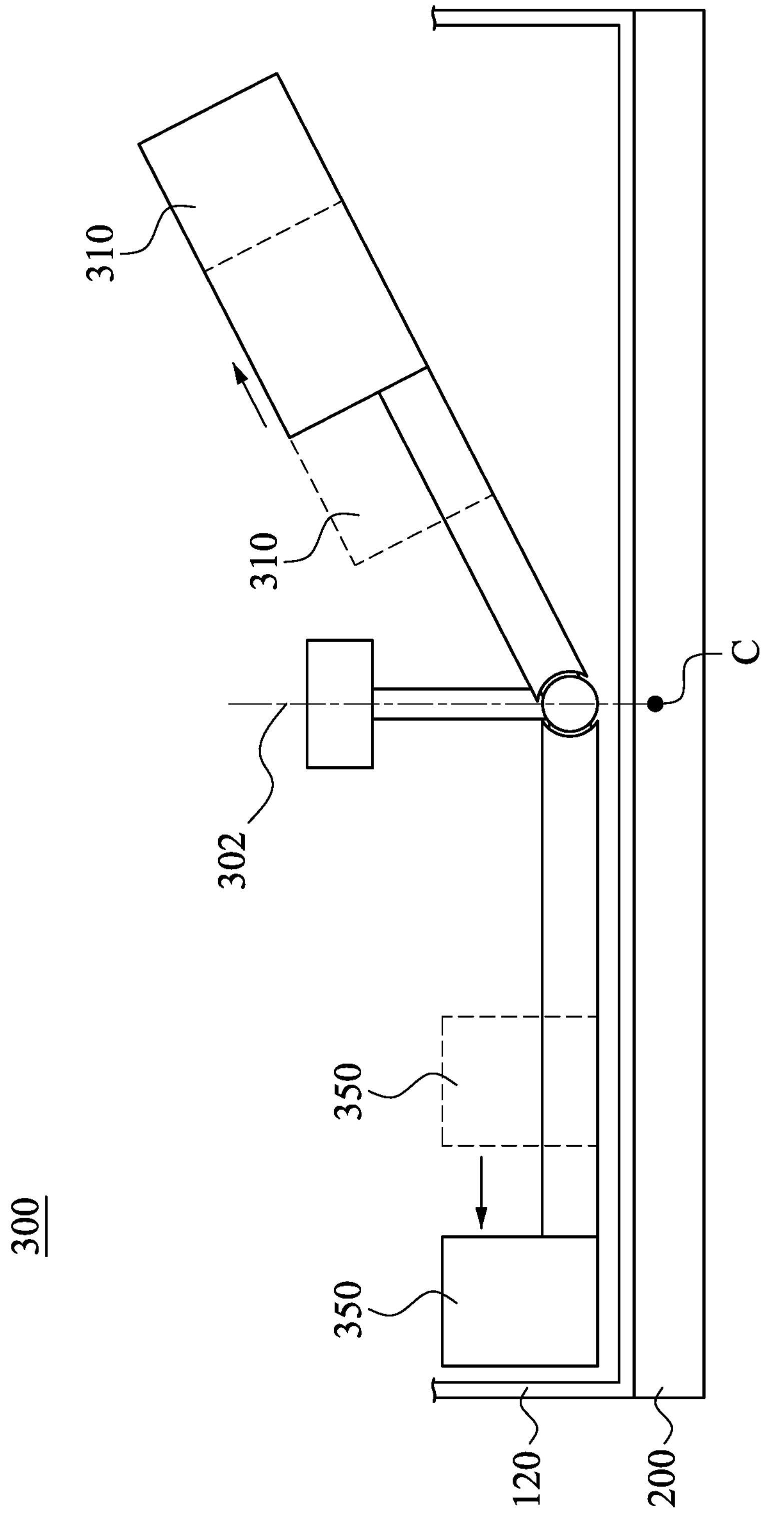

Reference is made to FIG. 4A and FIG. 4B, which are schematic side views of the magnetron 300 in different operation states according to some embodiments of the disclosure. In FIG. 4A, the first portion 332 of the telescopic arm assembly and the magnetic element 310 are tilted relative to the top (back) surface of the target holder 120 at a tilting angle θ. That is, the first portion 332 of the telescopic arm assembly of the magnetron 300 (or a bottom surface of the magnetic element 310) and the top (back) surface of the target holder 120 have the tilting angle θ therebetween. The tilting angle θ is greater than about 0 degree and is smaller than or equal to about 2 degrees. If the tilting angle θ is greater than about 2 degrees, the magnetron 300 might hit the process chamber; if the tilting angle θ is equal to about 0 degree, the magnet fields generated by the magnetron 300 are not tilted, and thus the consumption uniformity of the target 200 cannot be improved; if the tilting angle θ is smaller than about 0 degree, the magnetron 300 might hit the target holder 120. A distance d between the bottom surface of the magnetic element 310 and the top (back) surface of the target holder 120 is greater than about 0 mm and is smaller than or equal to about 3 mm. If the distance d is greater than about 3 mm, the magnetron 300 might hit the process chamber; if the distance d is equal to about 0 mm, the magnet fields generated by the magnetron 300 are not tilted, and thus the consumption uniformity of the target 200 cannot be improved; if the distance d is less than about 0 mm, the magnetron 300 might hit the target holder 120.

Then, in FIG. 4B, the magnetic element 310 is moved radially relative to an axis. For example, the axis can be the axis of rotation 302 that extends through the center C of the target 200. Therefore, the distance from the axis to the magnetic element 310 is increased or decreased. The counter weight 350 is moved in an opposite direction to balance the magnetic element 310. In some embodiments, the step of moving the magnetic element 310 radially relative to the axis can be performed before or after tilting the magnetic element 310. After the magnetic element 310 is tilted and is moved radially relative to the axis, the magnetic element 310 is moved about the axis of rotation 302. In some embodiments, the distance from the axis of rotation 302 to the magnetic element 310 and the tilting angle of the magnetic element 310 are fixed when the magnetic element 310 is moved about the axis of rotation 302.

By varying the distance from the axis of rotation 302 to the magnetic element 310 and the tilting angle of the magnetic element 310, the moving path of the magnetic element 310 about the axis of rotation 302 can be changed. Such motion enables an adjustable magnetic track that provides good consumption uniformity of the target and a short deposition time.

Figure 5:
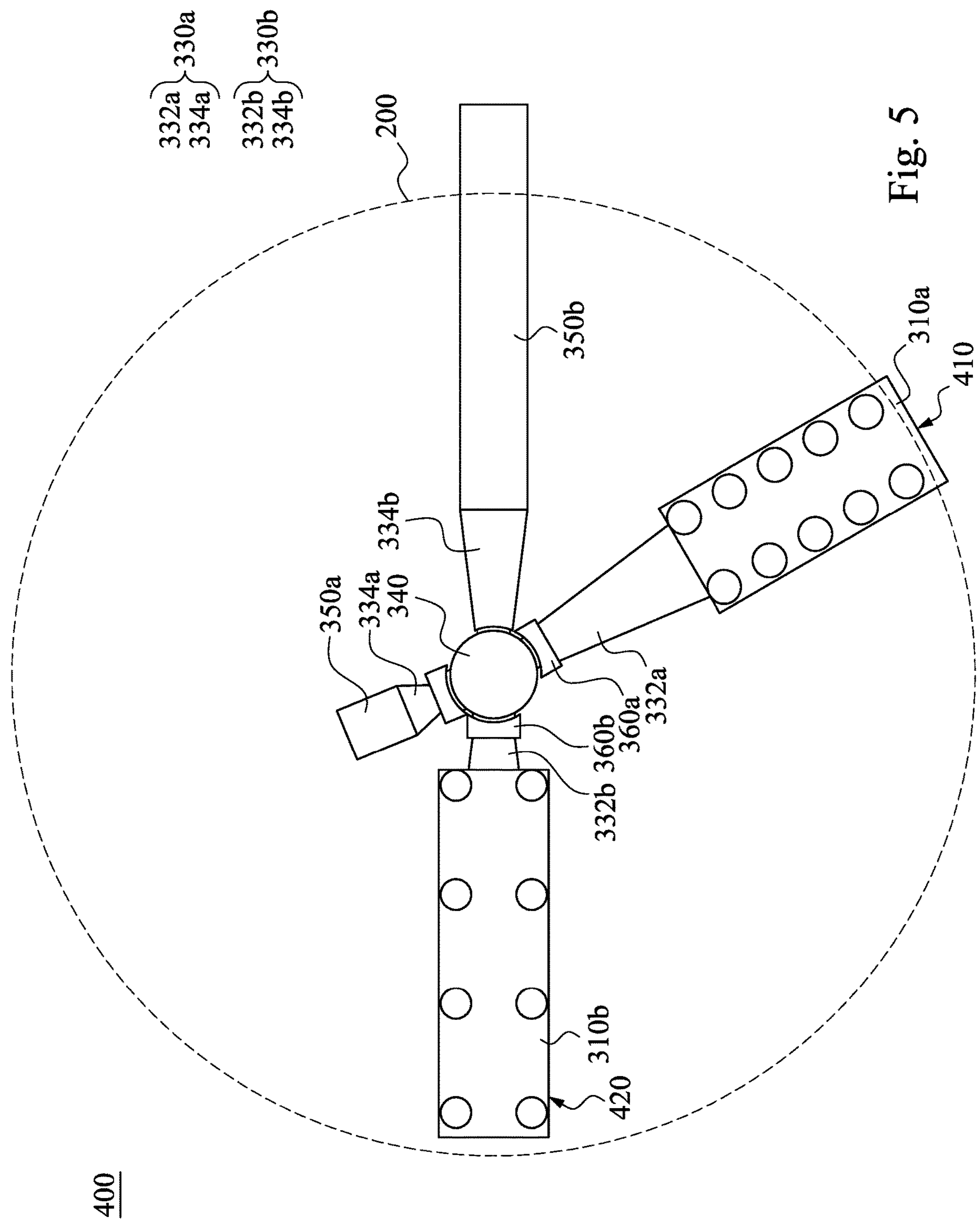
FIG. 5 is a schematic top view of a magnetron assembly utilized in the PVD apparatus according to some embodiments of the disclosure.

Reference is made to FIG. 5, which is a schematic top view of a magnetron assembly 400 of a PVD apparatus according to some embodiments of the disclosure. In some embodiments, the magnetron assembly 400 of the PVD apparatus includes a source magnetron 410 and an auxiliary magnetron 420. The source magnetron 410 includes a source magnetic element 310*a*, a first telescopic arm assembly 330*a* (including a first portion 332*a* and a second portion 334*a* as illustrated in FIG. 5), a first counter weight 350*a*, and a first hinge mechanism 360*a*. The source magnetic element 310*a*, the first telescopic arm assembly 330*a*, the first counter weight 350*a*, and the first hinge mechanism 360*a* are respectively similar to the magnetic element 310, the telescopic arm assembly 330, the counter weight 350, and the hinge mechanism 360 of FIG. 2 and thus are not repeated herein.

The auxiliary magnetron 420 includes an auxiliary magnetic element 310*b*, a second telescopic arm assembly 330*b* (including a first portion 332*b* and a second portion 334*b* as illustrated in FIG. 5), a second counter weight 350*b*, and a second hinge mechanism 360*b*. The auxiliary magnetic element 310*b*, the second telescopic arm assembly 330*b*, the second counter weight 350*b*, and the second hinge mechanism 360*b* are respectively similar to the magnetic element 310, the telescopic arm assembly 330, the counter weight 350, and the hinge mechanism 360 of FIG. 2 and thus are not repeated herein.

The PVD apparatus also includes a processing chamber, a target holder configured to hold a target, a power supply, a thickness detector, a gas system, a pedestal, a vacuum system, and a controller. The processing chamber, the target holder, the power supply, the thickness detector, the gas system, the pedestal, the vacuum system, and the controller of the PVD apparatus and the target are respectively similar to the processing chamber 110, the target holder 120, the power supply 130, the thickness detector 140, the gas system 150, the pedestal 160, the vacuum system 170, and the controller 180 of the PVD apparatus 100 and the target 200 of FIG. 1 and thus are not repeated herein.

One application of the magnetron assembly 400 is to sputter a barrier or liner layer over sides and a bottom of a via hole. To achieve deep penetration into the via hole, RF biases the wafer to attract the ions deep within the via hole to sputter etch the barrier layer at the bottom of the via hole. As such, the sputter etching and deposition at the bottom of the via hole can be balanced.

The uniformity of sputter etching and/or deposition can be improved by using both the source magnetron 410 and the auxiliary magnetron 420. In some embodiments, the source magnetron 410 and the auxiliary magnetron 420 have similar but nonetheless different structures. For example, the source magnetron 410 is smaller than the auxiliary magnetron 420, magnetically stronger than the auxiliary magnetron 420, and is positioned nearer the edge of the target 200. The auxiliary magnetron 420 is larger than the source magnetron 410, magnetically weaker than the source magnetron 410, and is located nearer the rotational shaft 340. The source magnetron 410 and the auxiliary magnetron 420 are rotated about the rotational shaft 340 to flatten the radial ion flux profile. The flattened radial ion flux profile increases the uniformity of sputter etching and/or deposition.

Figure 6:
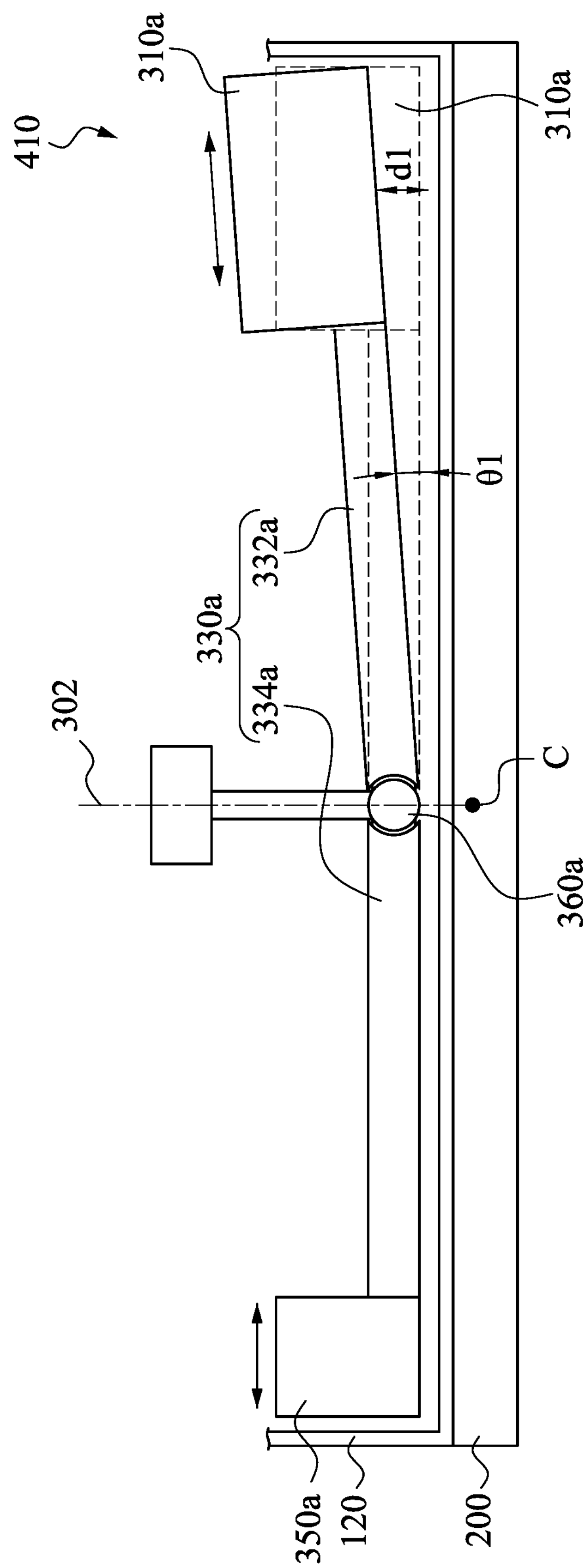
FIG. 6 and FIG. 7 are schematic side views of a magnetron assembly utilized in the PVD apparatus according to different embodiments of the disclosure.

In some embodiments, as shown in FIG. 6, the first portion 332*a* of the first telescopic arm assembly 330*a* and the source magnetic element 310*a* are tilted relative to the top (back) surface of the target holder 120 at a first tilting angle θ1. That is, the first portion 332*a* of first telescopic arm assembly 330*a* (or a bottom surface of the source magnetic element 310*a*) and the top (back) surface of the target holder 120 have the first tilting angle θ1 therebetween. The first tilting angle θ1 is greater than about 0 degree and is smaller than or equal to about 2 degrees. If the first tilting angle θ1 is greater than about 2 degrees, the source magnetron 410 might hit the process chamber; if the first tilting angle θ1 is equal to about 0 degree, the magnet fields generated by the source magnetron 410 are not tilted, and thus the consumption uniformity of the target 200 cannot be improved; if the first tilting angle θ1 is smaller than about 0 degree, the source magnetron 410 might hit the target holder 120. A first distance d1 between the bottom surface of the source magnetic element 310*a* of the source magnetron 410 and the top (back) surface of the target holder 120 is greater than about 0 mm and is smaller than or equal to about 3 mm. If the first distance d1 is greater than about 3 mm, the source magnetron 410 might hit the process chamber; if the first distance d1 is equal to about 0 mm, the magnet fields generated by the source magnetron 410 are not tilted, and thus the consumption uniformity of the target 200 cannot be improved; if the first distance d1 is less than about 0 mm, the source magnetron 410 might hit the target holder 120.

Figure 7:
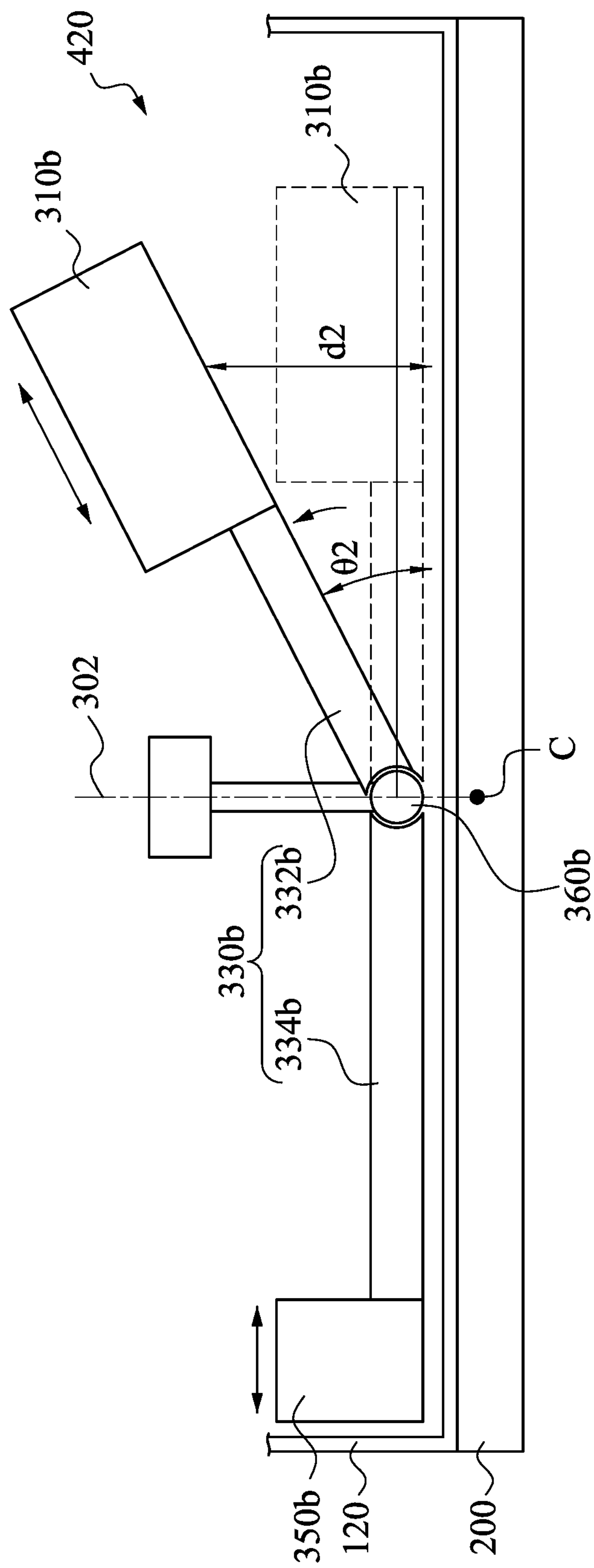

In some embodiments, as shown in FIG. 7, the first portion 332*b* of the second telescopic arm assembly 330*b* and the auxiliary magnetic element 310*b* are tilted relative to the top (back) surface of the target holder 120 at a second tilting angle θ2. That is, the first portion 332*b* of the second telescopic arm assembly 330*b* (or a bottom surface of the auxiliary magnetic element 310*b*) and the top (back) surface of the target holder 120 have the second tilting angle θ2 therebetween. The second tilting angle θ2 is greater than about 0 degree and is smaller than or equal to about 2 degrees. If the second tilting angle θ2 is greater than about 2 degrees, the auxiliary magnetron 420 might hit the process chamber; if the second tilting angle θ2 is equal to about 0 degree, the magnet fields generated by the auxiliary magnetron 420 are not tilted, and thus the consumption uniformity of the target 200 cannot be improved; if the second tilting angle θ2 is smaller than about 0 degree, the auxiliary magnetron 420 might hit the target holder 120. In some embodiments, the second tilting angle θ2 is greater than the first tilting angle θ1 to ensure that the auxiliary magnetic element 310*b* is closer to the axis of rotation 302 than the source magnetic element 310*a* is to the axis of rotation 302. A second distance d2 between the bottom surface of the auxiliary magnetic element 310*b* of the auxiliary magnetron 420 and the top (back) surface of the target 200 is greater than about 0 mm and is smaller than or equal to about 3 mm. If the second distance d2 is greater than about 3 mm, the auxiliary magnetron 420 might hit the process chamber; if the second distance d2 is equal to about 0 mm, the magnet fields generated by the auxiliary magnetron 420 are not tilted, and thus the consumption uniformity of the target 200 cannot be improved; if the second distance d2 is less than about 0 mm, the auxiliary magnetron 420 might hit the target holder 120. In some embodiments, the second distance d2 is greater than the first distance dl to ensure that the auxiliary magnetic element 310*b* is closer to the axis of rotation 302 than the source magnetic element 310*a* is to the axis of rotation 302.

Reference is made to FIG. 6. The source magnetic element 310*a* is moved in a first radial direction relative to the axis of rotation 302. In some embodiments, the step of moving the source magnetic element 310*a* in the first radial direction relative to the axis of rotation 302 can be performed before or after tilting the source magnetic element 310*a*. After the source magnetic element 310*a* is tilted and is moved in the first radial direction relative to the axis of rotation 302, the source magnetic element 310*a* is moved about the axis of rotation 302. In some embodiments, the distance from the axis of rotation 302 to the source magnetic element 310*a* and the tilting angle of the source magnetic element 310*a* are fixed when the source magnetic element 310*a* is moved about the axis of rotation 302.

Reference is made to FIG. 7. The auxiliary magnetic element 310*b* is moved in a second radial direction relative to the axis of rotation 302. In some embodiments, the step of moving the auxiliary magnetic element 310*b* in the second radial direction relative to the axis of rotation 302 can be performed before or after tilting the auxiliary magnetic element 310*b*. After the auxiliary magnetic element 310*b* is tilted and is moved in the second radial direction relative to the axis of rotation 302, the auxiliary magnetic element 310*b* is moved about the axis of rotation 302. In some embodiments, the distance from the axis of rotation 302 to the auxiliary magnetic element 310*b* and the tilting angle of the auxiliary magnetic element 310*b* are fixed when the auxiliary magnetic element 310*b* is moved about the axis of rotation 302.

Reference is made to FIG. 6. The first counter weight 350*a* is moved in a third radial direction relative to the axis of rotation 302 and opposite the first radial direction to balance the source magnetic element 310*a*. Reference is made to FIG. 7. The second counter weight 350*b* is moved in a fourth radial direction relative to the axis of rotation 302 and opposite the second radial direction to balance the auxiliary magnetic element 310*b*. In some embodiments, the steps of moving the first counter weight 350*a* in the third radial direction and moving the second counter weight 350*b* in the fourth radial direction are respectively performed simultaneously with moving the source magnetic element 310*a* in the first radial direction and moving the auxiliary magnetic element 310*b* in the second radial direction. In some embodiments, the steps of moving the first counter weight 350*a* in the third radial direction and moving the second counter weight 350*b* in the fourth radial direction are performed prior to moving the source magnetic element 310*a* and the auxiliary magnetic element 310*b* about the axis of rotation 302. In some embodiments, the distance from the axis of rotation 302 to the first counter weight 350*a* and the distance from the axis of rotation 302 to the second counter weight 350*b* are fixed when the source magnetic element 310*a* and the auxiliary magnetic element 310*b* are moved about the axis of rotation 302.

Figure 8:
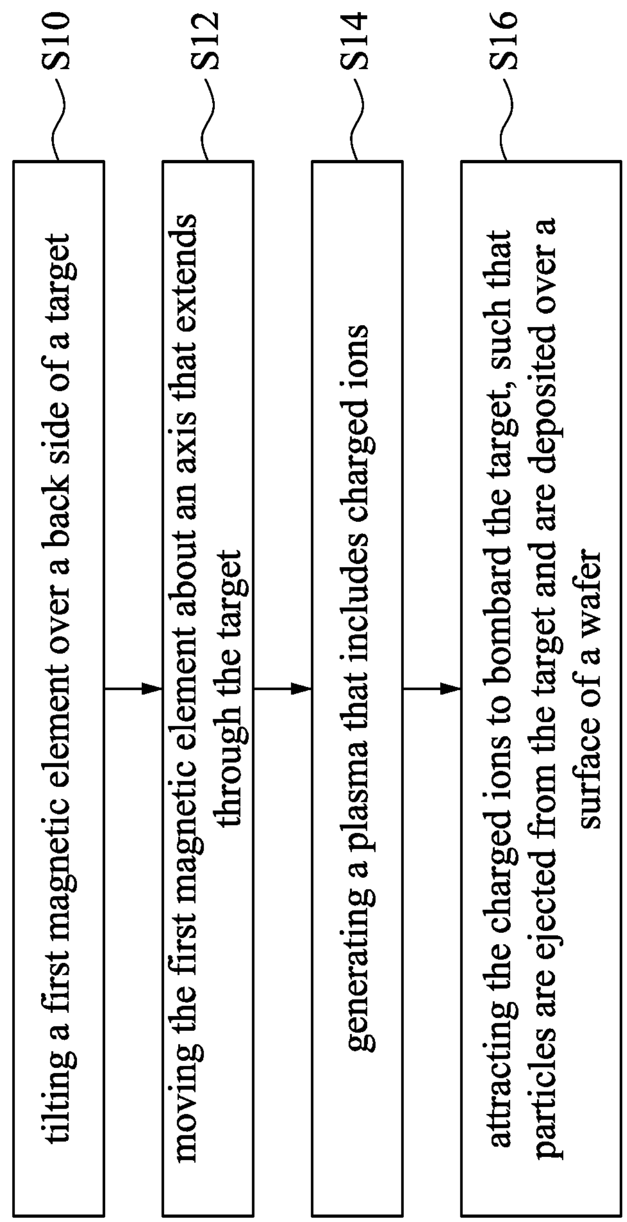
FIG. 8 and FIG. 9 are flow charts of operating a PVD apparatus according to different embodiments of the disclosure.

Reference is made to FIG. 8, which is a flow chart of operating a PVD apparatus according to some embodiments of the disclosure. The method begins on step S10, in which a first magnetic element over a back side of a target is tilted. In some embodiments, the first magnetic element is connected to a hinge mechanism through an arm, and the first magnetic element is tilted by using the hinge mechanism.

In step S12, the first magnetic element is moved about an axis that extends through the target. In some embodiments, the hinge mechanism is connected to a rotational shaft, and the axis is the axis of rotation of the rotational shaft. In some embodiments, the first magnetic element is tilted prior to moving the first magnetic element about the axis. In some embodiments, a tilting angle of the first magnetic element relative to the target is fixed when the first magnetic element is moved about the axis.

In step S14, a plasma that includes charged ions is generated, and then in step S16, the charged ions are attracted to bombard the target, such that particles are ejected from the target and are deposited over a surface of a wafer. In some embodiments, the tilting angle of the first magnetic element relative to the target is also fixed when the charged ions are attracted to bombard the target.

Figure 9:
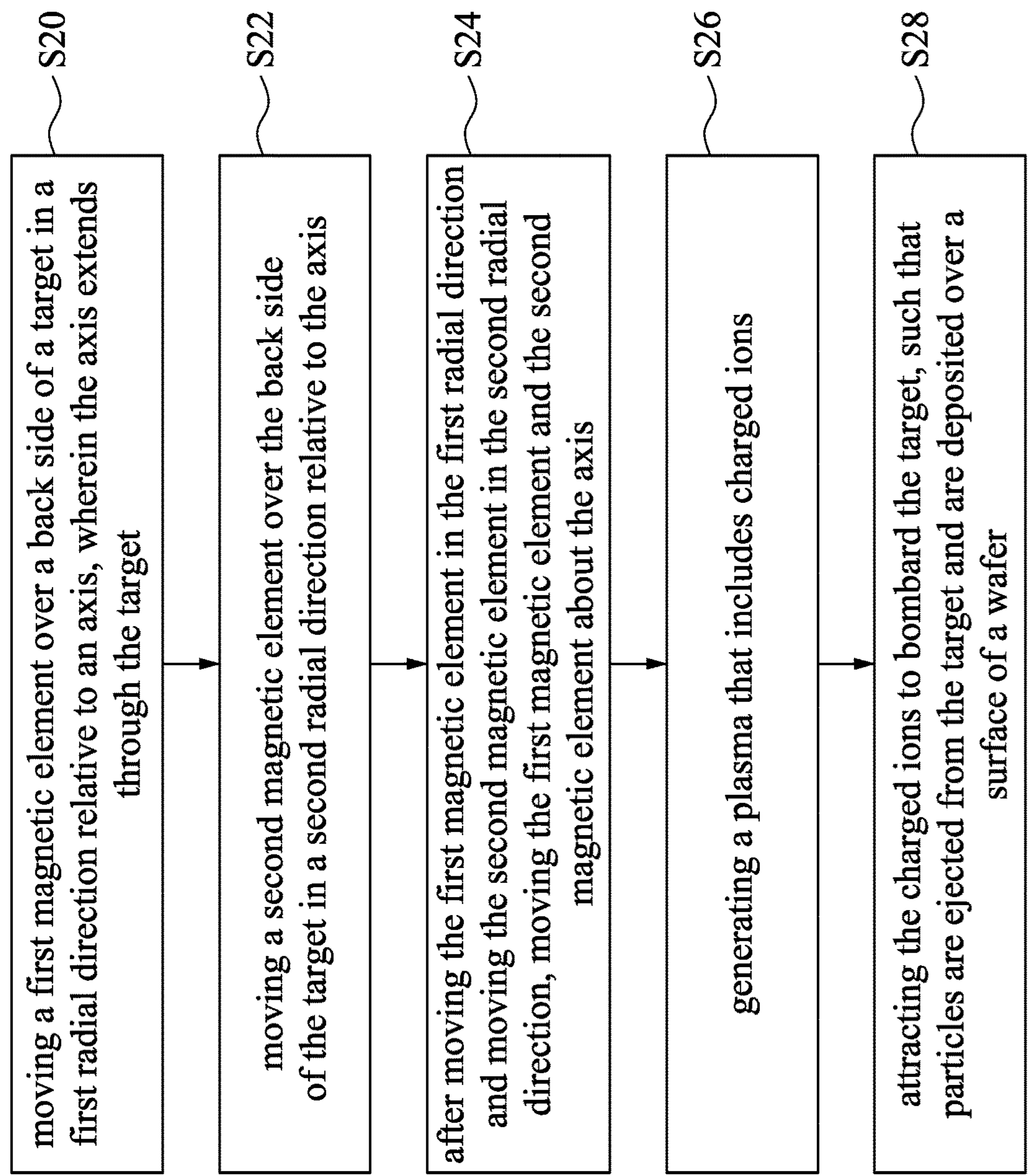

Reference is made to FIG. 9, which is a flow chart of operating a PVD apparatus according to some other embodiments of the disclosure. The method begins on step S20, in which a first magnetic element over a back side of a target is moved in a first radial direction relative to an axis, wherein the axis extends through the target.

In step S22, a second magnetic element over the back side of the target is moved in a second radial direction relative to the axis. In some embodiments, the second magnetic element is closer to the axis than the first magnetic element is to the axis.

In step S24, after moving the first magnetic element in the first radial direction and moving the second magnetic element in the second radial direction, the first magnetic element and the second magnetic element are moved about the axis.

In step S26, a plasma that includes charged ions is generated, and then in step S28, the charged ions are attracted to bombard the target, such that particles are ejected from the target and are deposited over a surface of a wafer.

The profile of the target after each PVD process varies because of the consumption of the target. By tilting the magnetic element relative to the target holder or the target and/or changing a distance from an axis of rotation to the magnetic element, the distribution of the magnetic fields can be more uniform, and thus the consumption of the target can be more uniform as well.

According to some embodiments of the disclosure, a method includes tilting a first magnetic element over a back side of a target. The first magnetic element is moved about an axis that extends through the target. A plasma including charged ions is generated. The charged ions are attracted to bombard the target, such that particles are ejected from the target and are deposited over a surface of a wafer.

According to some embodiments of the disclosure, a method includes moving a first magnetic element over a back side of a target in a first radial direction relative to an axis, wherein the axis extends through the target. The method includes moving a second magnetic element over the back side of the target in a second radial direction relative to the axis. After moving the first magnetic element in the first radial direction and moving the second magnetic element in the second radial direction, the first magnetic element and the second magnetic element are moved about the axis. A bias voltage is applied to the target. A plasma including charged ions is generated. The charged ions are attracted to bombard the target, such that particles are ejected from the target and are deposited over a surface of a wafer.

According to some embodiments of the disclosure, an apparatus includes a processing chamber configured to house a workpiece, a target holder in the processing chamber, a first magnetic element positioned over a backside of the target holder, a first arm assembly connected to the first magnetic element, a rotational shaft, and a first hinge mechanism connecting the rotational shaft and the first arm assembly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:

a processing chamber configured to house a workpiece;

a target holder in the processing chamber;

a first magnetic element over a backside of the target holder;

a first arm assembly connected to the first magnetic element;

a rotational shaft; and a first hinge mechanism connecting the rotational shaft and the first arm assembly, wherein the first arm assembly comprises a first prong and a second prong at opposite sides of the first hinge mechanism; and a controller programmed to control motion of the first arm assembly in such a way that the first prong revolves in an orbit motion path about the first hinge mechanism while the second prong remains stationary.

2. The apparatus of claim 1, wherein the first arm assembly is telescopic.

3. The apparatus of claim 2, further comprising:

a counter weight, wherein the first prong is connected to the first magnetic element and the second prong is connected to the counter weight.

4. The apparatus of claim 3, wherein the first hinge mechanism connects the rotational shaft and the first prong of the first arm assembly.

5. The apparatus of claim 1, further comprising:

a second magnetic element over the backside of the target holder; and a second arm assembly connecting the second magnetic element and the rotational shaft.

6. The apparatus of claim 5, further comprising:

a second hinge mechanism connecting the rotational shaft and the second arm assembly.

7. The apparatus of claim 5, further comprising:

a counter weight connected to the second arm assembly.

8. The apparatus of claim 1, wherein the first prong and the second prong are extendable.

9. An apparatus, comprising:

a wafer pedestal;

a sputter target holder above the wafer pedestal;

a first hinge above the sputter target holder;

a first rotatable arm above the sputter target holder, wherein the first rotatable arm is rotatable in a horizontal plane and comprises a first prong and a second prong at opposite sides of the first hinge, wherein the first prong is revolvable in an orbit motion path about the first hinge to lift an entirety of the first prong away from the sputter target holder;

a first magnetic element on a distal end of the first prong farthest from the first hinge; and a controller programmed to control motion of the first rotatable arm in such a way that the first prong revolves in the orbit motion path about the first hinge while the second prong remains stationary.

10. The apparatus of claim 9, further comprising:

a counterweight on a distal end of the second prong farthest from the first hinge.

11. The apparatus of claim 9, wherein the first prong and the second prong have variable lengths.

12. The apparatus of claim 9, further comprising:

a second hinge above the sputter target holder;

a second rotatable arm above the sputter target holder, wherein the second rotatable arm is rotatable in the horizontal plane and comprises a third prong and a fourth prong at opposite sides of the second hinge, wherein the third prong is revolvable in an orbit motion path about the second hinge to lift an entirety of the third prong away from the sputter target holder; and a second magnetic element on a distal end of the third prong farthest from the second hinge, wherein the first magnetic element is smaller than the second magnetic element.

13. The apparatus of claim 12, further comprising:

a counterweight on a distal end of the fourth prong of the second rotatable arm farthest from the second hinge.

14. The apparatus of claim 12, wherein the controller is further programmed to control motion of the second rotatable arm in such a way that the third prong revolves in the orbit motion path about the second hinge while the fourth prong remains stationary.

15. The apparatus of claim 12, wherein the third prong and the fourth prong have variable lengths.

16. An apparatus, comprising:

a wafer pedestal;

a sputter target holder above the wafer pedestal;

a first hinge and a second hinge above the sputter target holder;

a first rotatable arm comprising a first prong and a second prong extending from opposite sides of the first hinge along opposite directions;

a second rotatable arm comprising a third prong and a fourth prong extending from opposite sides of the second hinge along opposite directions;

a first magnetic element on the first prong of the first rotatable arm;

a second magnetic element on the third prong of the second rotatable arm, wherein the second magnetic element is magnetically weaker than the first magnetic element; and a controller programmed to control motion of the first rotatable arm in such a way that the first prong revolves in an orbit motion path about the first hinge while the second prong remains stationary.

17. The apparatus of claim 16, further comprising:

a first counterweight on the second prong of the first rotatable arm; and a second counterweight on the fourth prong of the second rotatable arm, wherein the second counterweight has a length greater than a length of the first counterweight from a top view.

18. The apparatus of claim 16, wherein the first prong of the first rotatable arm is revolvable about the first hinge in a vertical plane.

19. The apparatus of claim 16, wherein the third prong of the second rotatable arm is revolvable about the second hinge in a vertical plane.

20. The apparatus of claim 16, wherein one or more of the first, second, third, and fourth prongs are telescopic.

* * * * *